(12) United States Patent
Huang et al.

(10) Patent No.: US 8,209,577 B2
(45) Date of Patent: Jun. 26, 2012

(54) OPTIMIZING XOR-BASED CODES

(75) Inventors: Cheng Huang, Bellevue, WA (US); Jin Li, Sammamish, WA (US); Minghua Chen, Hong Kong (CN)

(73) Assignee: Microsoft Corporation, Redmond, WA (US)

( * ) Notice: Subject to any disclaimer, the term of this patent is extended or adjusted under 35 U.S.C. 154(b) by 1056 days.

(21) Appl. No.: 11/961,866

(22) Filed: Dec. 20, 2007

(65) Prior Publication Data

US 2009/0164762 A1 Jun. 25, 2009

(51) Int. Cl.
*H03M 13/00* (2006.01)
(52) U.S. Cl. .......... 714/752; 714/6.2; 714/767; 714/770
(58) Field of Classification Search .................. 714/752
See application file for complete search history.

(56) References Cited

U.S. PATENT DOCUMENTS

| | | | |
|---|---|---|---|
| 6,357,030 B1 | 3/2002 | Demura | |
| 6,463,564 B1 | 10/2002 | Weng | |
| 6,631,485 B1 | 10/2003 | Morley et al. | |
| 6,748,488 B2 | 6/2004 | Byrd et al. | |
| 7,080,278 B1 | 7/2006 | Kleiman et al. | |
| 7,472,334 B1 * | 12/2008 | Scott et al. | 714/785 |
| 2003/0074627 A1 * | 4/2003 | MacDougall | 714/786 |
| 2003/0172293 A1 | 9/2003 | Johnson et al. | |
| 2004/0260994 A1 | 12/2004 | Winograd et al. | |
| 2006/0123321 A1 * | 6/2006 | Deenadhayalan et al. | 714/763 |
| 2006/0129873 A1 | 6/2006 | Hafner | |
| 2006/0218470 A1 | 9/2006 | Dickson | |
| 2009/0083590 A1 * | 3/2009 | Wylie et al. | 714/703 |

OTHER PUBLICATIONS

Plank, James; A New MDS Erasure Code for RAID-6; Sep. 25, 2007; http://web.eecs.utk.edu/~plank/plank/papers/CS-07-602.html.*
Ping-Hsun Hsieh, Ing-Yi Chen, Yu-Ting Lin, and Sy-Yen Kuo. 2004. An XOR Based Reed-Solomon Algorithm for Advanced RAID Systems. In Proceedings of the Defect and Fault Tolerance in VLSI Systems, 19th IEEE International Symposium (DFT '04). IEEE Computer Society, Washington, DC, USA, 165-172.*
Blaum, M., J. Brady, J. Bruck, and J. Menon, Evenodd: An efficient scheme for tolerating double disk failures in RAID architectures, IEEE Trans. on Comp., Feb. 1995, vol. 44, No. 2, pp. 192-202.
Blaum, M., J. Bruck, and A. Vardy, MDS array codes with independent parity symbols, IEEE Trans. Information Theory, Mar. 1996, vol. 42, No. 2, pp. 529-542.
Blömer, J., M. Kalfane, R. Karp, M. Karpinski, M. Luby, and D. Zuckerman, An XOR-based erasure-resilient coding scheme, Tech. Report No. TR-95-048, ICSI, Berkeley, California, Aug. 1995.
Chen, P. M., E. K. Lee, G. A. Gibson, R. H. Katz, and D. A. Patterson, RAID—High-Performance, reliable secondary storage, ACM Computing Surveys, 1994, vol. 26, No. 2, pp. 145-185.

(Continued)

*Primary Examiner* — Scott Baderman
*Assistant Examiner* — Justin R Knapp
(74) *Attorney, Agent, or Firm* — Lyon & Harr, LLP; Mark A. Watson

(57) ABSTRACT

A "code optimizer" provides various techniques for optimizing arbitrary XOR-based codes for encoding and/or decoding of data. Further, the optimization techniques enabled by the code optimizer do not depend on any underlining code structure. Therefore, the optimization techniques provided by the code optimizer are applicable to arbitrary codes with arbitrary redundancy. As such, the optimized XOR-based codes generated by the code optimizer are more flexible than specially designed codes, and allow for any desired level of fault tolerance. Typical uses of XOR-based codes include, for example, encoding and/or decoding data using redundant data packets for data transmission real-time communications systems, encoding and/or decoding operations for storage systems such as RAID arrays, etc.

18 Claims, 6 Drawing Sheets

OTHER PUBLICATIONS

Corbett, P., B. English, A. Goel, T. Grcanac, S. Kleiman, J. Leong, and S. Sankar, Row-diagonal parity for double disk failure correction, The 4th USENIX Conference on File and Storage Technologies (FAST 2005), San Francisco, CA, Dec. 2005.

Feng, G.-L., R. H. Deng, F. Bao, and J.-C. Shen, New efficient MDS array codes for RAID Part I: Reed-Solomon-like codes for tolerating three disk failures, IEEE Trans. on Computers, vol. 54, No. 9, Sep. 2005.

Feng, G.-L., R. H. Deng, F. Bao, and J.-C. Shen, New efficient MDS array codes for RAID Part II: Rabin-like codes for tolerating multiple (>=4) disk failures, IEEE Trans. on Computers, 54(12), Dec. 2005.

Hafner, J. L., WEAVER codes: Highly fault tolerant erasure codes for storage systems, Proc. of the 4th USENIX Conf. on File and Storage Technologies, 2005, pp. 211-224, vol. 4, San Francisco, CA.

Huang, C., M. Chen, and J. Li, Pyramid codes: Flexible schemes to trade space for access efficiency in reliable data storage systems, IEEE Int'l Symposium on Network Computing and Applications (NCA 2007), Jul. 2007, Cambridge, MA.

Huang, C., and L. Xu, STAR: An efficient coding scheme for correcting triple storage node failures, 4th USENIX Conf. on File and Storage Technologies (FAST 2005), San Francisco, CA, Dec. 2005.

Plank, J. S., and M. G. Thomason, On the practical use of LDPC erasure codes for distributed storage applications, Tech. Report UT-CS-03-510, University of Tennessee, Sep. 23, 2003.

Plank, J. S., L. X. Wayne, Optimizing cauchy reed-solomon codes for fault-tolerant network storage applications, Proc. of the Fifth IEEE Int'l Symposium on Network Computing and Applications, 2006, pp. 173-180.

* cited by examiner

OPTIMIZING XOR-BASED CODES

BACKGROUND

1. Technical Field

A "code optimizer" is related to optimizing XOR-based codes for encoding and decoding of data, and in particular, to various techniques for optimizing generic XOR-based codes using a unique "common operations first" (COF) approach that enables increased coding efficiencies through optimization of existing XOR-based codes having arbitrary levels of fault tolerance.

2. Related Art

Erasure correcting codes are often adopted by storage applications and data transmission applications to provide fault tolerance. One simple example of conventional fault-tolerant storage is a conventional RAID array of hard drives. In a typical RAID array, complete recovery of encoded data stored within the array is possible given the failure of one or more nodes (i.e., the individual hard drives in the array), depending upon the RAID level being used. In the data transmission scenario, fault-tolerant data transmission typically involves some level of redundancy in transmission of data packets such that if one or more packets is lost or overly delayed, the underlying message can still be reconstructed without error.

For conventional fault-tolerant storage applications, encoding and decoding complexity is a key concern in determining which codes to use. Conventional XOR-based codes use pure XOR operation during coding computations. As such, implementation of XOR-based codes is very efficient in both hardware and software. Consequently, such codes are highly desirable in fault-tolerant storage applications. Further, as is known to those skilled in the art, XOR-based codes can be implemented by transforming any existing code defined in finite fields to an XOR-based code.

For example, one conventional XOR-based coding technique constructs XOR-based codes from Reed-Solomon codes to protect packet losses in communication networks. Reed-Solomon codes are both well known and widely used by those skilled in the art of data encoding and decoding. One of the advantages of Reed-Solomon codes is that they are both flexible in coding parameters and capable of recovering from a maximum number of failures (the MDS or "Maximum Distance Separable" property). For these reasons, Reed-Solomon codes would appear to be natural choices for fault-tolerant data storage applications. However, the common understanding and teachings in the art have previously assumed that XOR-based Reed-Solomon codes are inefficient. This belief that generic Reed-Solomon codes are inefficient leads directly to the general conclusion that such codes are generally inappropriate for storage applications where efficiency is an important concern since efficiency directly corresponds to encoding and decoding speed, and thus to the overall performance of the storage system.

For these and other reasons, rather than use Reed-Solomon codes for fault-tolerant storage applications, the conventional approach over many years has been directed towards designing specific XOR-based codes for particular applications. Unfortunately, one problem of specifically designed XOR-based codes is that they are generally not very flexible. For example, XOR-based codes providing 2- or 3-fault tolerance (wherein the system can fully recover from 2 or 3 storage node failures, respectively) have been well studied and implemented in a number of conventional storage systems. However, efficient codes offering redundancy higher than 2- or 3-fault tolerance are more difficult to implement, though there are several such coding schemes using specifically designed XOR-based codes.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In general, a "code optimizer" provides various techniques for optimizing arbitrary XOR-based codes. Efficiencies of the resulting optimized codes compare well with specially designed XOR-based codes, and allow the use of any desired XOR-based codes for encoding and/or decoding of data, data transmission applications, fault-tolerant storage applications, etc. Further, the optimization techniques enabled by the code optimizer do not depend on the underlining structures of XOR-based codes. Therefore, the optimization techniques provided by the code optimizer are applicable to arbitrary XOR-based codes having arbitrary levels of redundancy.

More specifically, as is well known to those skilled in the art, the complexity of an XOR-based code is generally determined by the total number of XOR operations in encoding or decoding. Therefore, reducing the complexity of an XOR-based code can be achieved by reducing the number of XOR operations of a particular code. The code optimizer optimizes such codes by reducing the total number of XOR operations through a dynamic optimization process. This optimization process makes use of a concept referred to herein as "common operation first" (COF), for use in enabling various greedy algorithms for optimizing the encoding and/or decoding of arbitrary XOR-based codes.

The concept of "common operations" (more specifically "common XOR operations") refers to the case where the same XOR operation is required more than once. In this case, the common XOR operation is computed once, with the result then being used to simplify subsequent XOR operations. This idea is used in creating an optimization technique referred to herein as COF, or as the "COF rule".

The optimization performed by the code optimizer can be described as a technique for finding an optimal computation path that computes all required outputs while minimizing the total number of XOR operations. In various embodiments, the identification of the computation path for optimizing XOR-based codes is treated as an NP-complete path problem. In particular, various "greedy" approaches are implemented by the code optimizer for use in finding approximate solutions to the problem of optimizing arbitrary XOR-based codes using various multi-level matching and elimination processes for reducing a total number of XOR operations relative to common or shared XOR operations. The resulting optimized codes are unexpectedly efficient in view of the conventional teachings regarding an assumed unsuitability of arbitrary XOR-based codes for use in applications such as fault-tolerant storage systems and real-time packet-based communications systems.

For example, when the optimization techniques enabled by the code optimizer are applied to generic XOR-based Reed-Solomon codes, it has been observed that the resulting optimized XOR-based codes equally efficient, and in some cases more efficient than well known specifically designed XOR-based codes, depending upon the redundancy level of those codes.

In particular, in a 2-fault-tolerant case, generic XOR-based Reed-Solomon codes optimized by the code optimizer have been observed to be more efficient in encoding than well known conventional "EVENODD coding." Further, the resulting optimized codes have also been observed to be approximately equally efficient in encoding operations as the well known "RDP coding" scheme. Similarly, in a 3-fault-tolerant case, generic XOR-based Reed-Solomon codes optimized by the code optimizer have been observed to be more efficient in encoding than both generalized EVENODD codes and the well known "STAR coding" scheme. In most cases, the resulting optimized codes are also more efficient in decoding operations than conventional XOR-based coding schemes.

In view of the above summary, it is clear that the code optimizer described herein provides a variety of unique techniques for optimizing arbitrary XOR-based codes having arbitrary levels of redundancy. In addition to the just described benefits, other advantages of the code optimizer will become apparent from the detailed description that follows hereinafter when taken in conjunction with the accompanying drawing figures.

DESCRIPTION OF THE DRAWINGS

The specific features, aspects, and advantages of the present invention will become better understood with regard to the following description, appended claims, and accompanying drawings where:

DETAILED DESCRIPTION OF THE PREFERRED EMBODIMENTS

Figure 1:
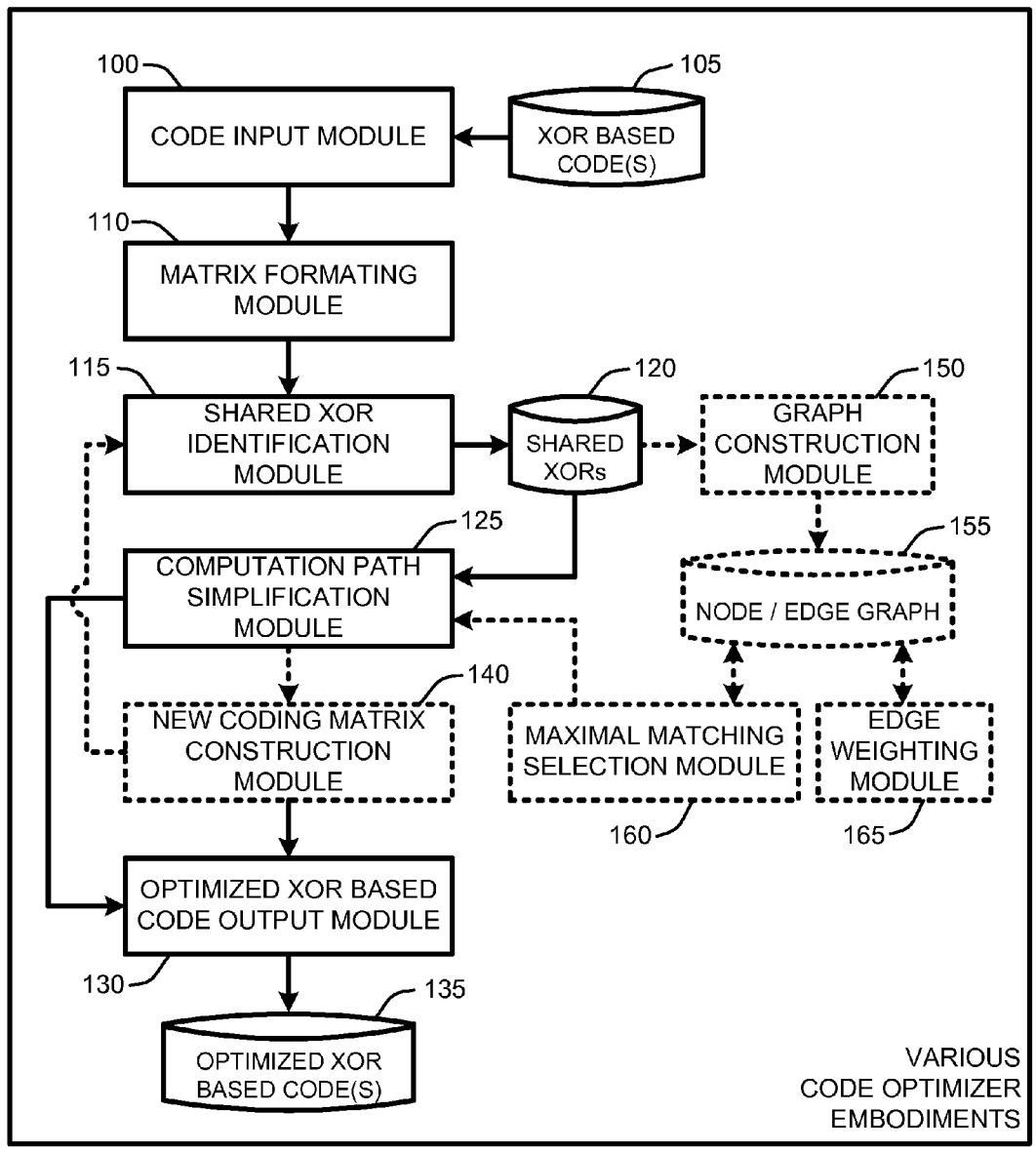
FIG. 1 provides an exemplary architectural flow diagram that illustrates program modules for implementing various embodiments of a code optimizer, as described herein.

In the following description of the preferred embodiments of the present invention, reference is made to the accompanying drawings, which form a part hereof, and in which is shown by way of illustration specific embodiments in which the invention may be practiced. It is understood that other embodiments may be utilized and structural changes may be made without departing from the scope of the present invention.

1.0 Introduction:

In general, a "code optimizer," as described herein, provides various techniques for reducing the complexity of arbitrary XOR-based codes. The reduction in complexity is generally based on a concept described herein as "common operations first" (COF), wherein one or more pairs of common XOR operations are identified for an arbitrary XOR based code. The results of one or more of the identified common operations are then computed, with the result then being used in simplifying subsequent XOR based operations that would otherwise require a repeated computation of the common or shared XOR operation. The result is an optimized XOR based code having reduced complexity in terms of a total number of XOR operations. Further, the resulting optimized codes are unexpectedly efficient in view of the conventional teachings regarding an assumed unsuitability of arbitrary XOR-based codes for use in applications such as fault-tolerant storage systems and real-time packet-based communications systems.

1.1 System Overview:

As noted above, the code optimizer provides various techniques for reducing the complexity of arbitrary XOR-based codes. More specifically, as described in greater detail in Section 2, the code optimizer provides various techniques for optimizing existing arbitrary XOR based codes of any level of complexity and redundancy. In general, the optimization problem can be described as a technique for finding an optimal computation path that computes all required outputs while minimizing the total number of XOR operations.

In various embodiments, the identification of the computation path for optimizing XOR-based codes is treated as an NP-complete path problem. Further, various "greedy" approaches are implemented in various embodiments of the code optimizer for use in finding approximate solutions to the problem of optimizing arbitrary XOR-based codes using various multi-level matching and elimination processes for reducing a total number of XOR operations relative to common or shared XOR operations.

In general, for XOR-based encoding operations, the code optimizer will evaluate an arbitrary XOR based code and return a single optimized XOR based code having a reduced complexity. In various embodiments, depending upon original code complexity, this optimized XOR based code is either pre-computed for a particular XOR based code, or computed at runtime. However, it should be noted that pre-computing and storing the optimized XOR based code is generally more efficient than evaluating an existing code in order to optimize that code at run time.

In contrast to XOR based encoding operations, there may be a large number of possible optimized decoding paths for a particular XOR based code. For example, in the general case of XOR based decoding operations, the XOR code sequence generally depends upon an erasure pattern of data blocks. In other words, assuming that one or more random data blocks are lost or otherwise unavailable, a different sequence of XOR operations will be required to recover the data of the lost data blocks depending upon the particular erasure pattern.

There are two ways to handle this issue of erasure patterns. First, a lookup table or the like can be used to store a different optimized XOR decoding path for each of the possible erasure patterns. Then, whenever a particular erasure pattern is actually observed, the corresponding optimized XOR decoding path or sequence is retrieved and used to recover the lost data blocks. However, in the event that there are very large numbers of possible erasure patterns, depending upon the complexity of the erasure code, it may be more efficient to compute an optimized XOR decoding sequence based on the actual loss pattern. In either case, computation of the optimized XOR decoding sequence proceeds in the same manner, as described in further detail herein.

1.2 System Architectural Overview:

The processes summarized above are illustrated by the general system diagram of FIG. 1. In particular, the system diagram of FIG. 1 illustrates the interrelationships between program modules for implementing various embodiments of the code optimizer, as described herein. Furthermore, while the system diagram of FIG. 1 illustrates various embodiments of the code optimizer, FIG. 1 is not intended to provide an exhaustive or complete illustration of every possible embodiment of the code optimizer as described throughout this document.

In addition, it should be noted that any boxes and interconnections between boxes that are represented by broken or dashed lines in FIG. 1 represent alternate embodiments of the code optimizer described herein, and that any or all of these alternate embodiments, as described below, may be used in combination with other alternate embodiments that are described throughout this document.

In general, as illustrated by FIG. 1, in one embodiment, the code optimizer begins operation by using a code input module 100 to receive one or more arbitrary XOR based codes 105. As described herein, these arbitrary XOR based codes may be either or both coding and decoding codes used for redundant coding of data.

A matrix formatting module 110 then places each XOR based code 105 into a matrix format, wherein columns represent required outputs of the code, and rows including a non-zero value in a particular column indicate that the corresponding input is to be used in computing the corresponding output (see Section 2.3.1 and Equation (4) for an example of this point).

Once the XOR based code has been formatted as a coding matrix by the matrix formatting module 110, the code optimizer used a shared XOR identification module 115 to identify specific shared XOR operations 120 of inputs that are shared between two or more outputs. In one embodiment, the shared XORs 120 are then used by a computation path simplification module 125 to simplify the computation path (which will compute all of the outputs) using shared XORs to reduce the total number of XOR operations required for one or more of the individual outputs.

In general, the total number of XORs is reduced by the computation path simplification module 125 by computing shared XORs only once, then using the result of the computed shared XOR to replace corresponding XOR operations with respect to one or outputs, as appropriate. (See Section 2.3.1 for specific details and examples). In one embodiment, the simplified computation path is then provided to an optimized XOR based code output module 130 which stores the path as an optimized XOR based code 135 for use as desired.

There are a number of additional embodiments which are used for arriving at the optimized XOR based code 135. For example, in one embodiment, a new coding matrix construction module 140 is used to construct a new coding matrix (see Section 2.5.2 and Equation (15) for specific details and examples). In general, the new coding matrix extends the original coding matrix by adding a new row for each computed shared XOR, with a non-zero entry being added in each column corresponding to an output where the shared XOR is to be used. In addition, all matrix entries corresponding to the shared XORs in the original coding matrix are zeroed.

In one embodiment, the resulting new coding matrix is then provided to the optimized XOR based code output module 130, which outputs the optimized XOR based code 135 corresponding to the new coding matrix. However, in another embodiment, the new coding matrix is instead evaluated by the shared XOR identification module 115 to determine whether there are any new or additional shared XORs resulting from construction of the new coding matrix. If there are new or additional shared XORs, then the computation path simplification module 125 operates on the new coding matrix in the same manner as described above with respect to the original coding matrix output by the matrix formatting module 110. Otherwise, the optimized XOR based code output module 130 simply outputs the optimized XOR based code 135, as described above. Note that this iterative matrix construction process can continue for as long as new shared XORs are identified. However, the iterative process is inherently self-terminating after a finite number of iterations, depending upon the complexity of the original coding matrix.

In another embodiment, once the shared XORs 120 have been identified by the shared XOR identification module 115, a graph construction module 150 constructs a graph 155 using each of the matrix inputs as nodes, and the XORs corresponding to each of the outputs as edges (or connections) between two or more nodes. In general, an edge between any two nodes is assigned a connection between nodes that indicates an XOR operation between those nodes (see Section 2.5.2 and FIG. 3 for specific details and examples). An edge counter assigned to each edge then counts the number of times that the corresponding XOR operation of the adjoining nodes is computed. In other words, the edge counter corresponds to the total number of times that a particular XOR operation of two inputs is shared.

Given the node/edge graph 155 of the inputs and outputs of the matrix, in one embodiment, a maximal matching selection module 160 evaluates the graph to identify "matchings" of edges in the graph. In general, as described in further detail in Section 2.5.2, each matching represents any set of edges where there are no two edges that share the same node. Further, a "maximum matching" is a matching having the maximum number of edges for a particular graph 155. The maximal matching selection module 160 uses these concepts to identify and select one or more maximal matchings from the graph 155.

Since each edge corresponds to an XOR operation between nodes, the node pairs connected by each of the edges in the selected maximal matching are then used as the identified shared XORs by the computation path simplification module 125. As noted above, the computation path simplification module 125 simplifies the computation path by computing shared XORs only once, then using the result of the computed shared XOR to replace corresponding XOR operations with respect to one or outputs, as appropriate. It should be noted that the new coding matrix construction module 140 may also be used at this point, as described above, to construct a new coding matrix that is evaluated for new or additional shared XORs, with the computation path simplification module 125 then operating on the new coding matrix in the same manner as described above.

In yet another embodiment, as described in detail in Section 2.5.3, once the shared XORs 120 have been identified by the shared XOR identification module 115, the graph construction module 150 constructs the graph 155 using each of the matrix inputs as nodes, and the XORs corresponding to each of the outputs as edges, as discussed above. However, prior to evaluating the graph using the maximal matching selection module 160, an edge weighting module 165 is used to weight the edges having the maximum counter value. The weight assigned to each edge is based on a density of each corresponding node, where the density, or degree, of a particular node depends upon the total number of edges entering that node.

Once these edges have been weighted, the maximal matching selection module 160 then identifies one or maximal matchings, and in the case where there are more than one maximal matchings, the maximal matching selection module selects the maximal matching having the highest weight score based on sum of the corresponding edge weights. Given the selected maximal matching, the node pairs connected by each of the edges in the selected maximal matching are then used as the identified shared XORs by the computation path simplification module 125, as described above. Again, the end result of this process is an optimized XOR based code 135 that is provided by the optimized XOR based code output module.

2.0 Operation Overview:

The above-described program modules are employed for implementing various embodiments of the code optimizer. As summarized above, the code optimizer provides various techniques for reducing the complexity of arbitrary XOR-based codes for use in encoding and/or decoding operations. The following sections provide a detailed discussion of the operation of various embodiments of the code optimizer, and of exemplary methods for implementing the program modules described in Section 1 with respect to FIG. 1.

2.1 Operational Details of the Code Optimizer:

In general, the code optimizer provides various techniques for reducing the complexity of arbitrary XOR-based codes for use in encoding and/or decoding operations. In particular, the following paragraphs describe conventional XOR based EVENODD coding; coding from a matrix perspective; optimization of a 2-fault tolerant Reed-Solomon code; optimizing arbitrary XOR based codes; and performance and practicality considerations.

2.2 Conventional XOR-Based EVENODD Coding:

As noted above, the code optimizer provides optimization for arbitrary XOR-based codes. Consequently, in order to better describe the functionality of the code optimizer, conventional coding techniques, such as the well known EVENODD coding technique are first described in the following sections to provide a baseline that will assist in providing better understanding of the specific operational details of the code optimizer.

2.2.1 Conventional XOR-Based EVENODD Encoding:

As is well known to those skilled in the art, conventional EVENODD codes are XOR-based codes that are widely used in fault-tolerant storage applications (such as RAID arrays, for example). Many other schemes adopt a similar concept, where data blocks are arranged in a two dimensional array and XORs are the only required operations. Schemes as such are often referred as array codes. One of the key advantages of array codes is the low complexity generally associated with such codes. This low complexity directly translates to coding (and decoding) efficiency that is considered to be an especially desirable trait for storage applications.

For purposes of explanation, a simple example of conventional EVENODD codes is described below. In particular, for EVENODD encoding, consider a typical "(5, 3) EVENODD code." In this type of code, there are 3 data blocks (k=3) and 2 redundant blocks (r=2). An EVENODD code is in the form of a (p−1)×(p+2) two dimensional array, where p is a prime number, and each block is segmented into (p−1) cells.

Therefore, for this particular EVENODD code, where p=3, each of the three data blocks is segmented into 2 cells to provide a total of 6 data elements $[d_1\ d_2\ d_3\ d_4\ d_5\ d_6]$, where the first data block is segmented into $[d_1\ d_2]$, the second data block is segmented into $[d_3\ d_4]$, and the third data block is segmented into $[d_4\ d_5]$. A total of four parity cells $[c_1\ c_2\ c_3\ c_4]$ is then used in encoding the data for this EVENODD code.

In particular, a first redundant block (comprising $[c_1\ c_2]$) is simply the XOR of all the data blocks. In terms of cells, these data blocks can be represented as illustrated by Equation 1, where the symbol "$\oplus$" is used to represent an XOR operation:

$$c_1 = d_1 \oplus d_3 \oplus d_5$$

$$c_2 = d_2 \oplus d_4 \oplus d_6 \quad \text{Equation (1)}$$

where $c_1$ and $c_2$ are typically referred to as horizontal parities. A second redundant data block (comprising $[c_3\ c_4]$) is then computed as illustrated by Equation (2), where:

$$S = d_4 \oplus d_5$$

$$c_3 = d_1 \oplus d_6 \oplus S$$

$$c_4 = d_2 \oplus d_3 \oplus S \quad \text{Equation (2)}$$

where S is typically referred to as an "adjustor," and where $c_3$ and $c_4$ are typically referred to as diagonal parities. It is easy to see that the total number of XOR operations in a conventional (5, 3) EVENODD code, as shown in Equation (1) and Equation (2) is 9 XORs. Furthermore the resulting data blocks include the five following data blocks: $[d_1\ d_2]$, $[d_3\ d_4]$, $[d_5\ d_6]$, $[c_1\ c_2]$, and $[c_1\ c_2]$.

2.2.1 Conventional XOR-Based EVENODD Decoding:

The (5, 3) EVENODD code illustrated above guarantees recoverability of all data when there are no more than two block failures (which can be any two of the five blocks shown above). For example, consider a particular failure pattern where the second and the third data blocks (i.e., $[d_3\ d_4]$ and $[d_5\ d_6]$) are unavailable. Decoding in this case is straightforward. In particular, using all the remaining parity blocks, the adjustor, S, can first be computed as illustrated by Equation (3), where:

$$S = c_1 \oplus c_2 \oplus c_3 \oplus c_4 \quad \text{Equation (3)}$$

Once S is known, $d_6$ can be computed as $d_6 = c_3 \oplus d_1 \oplus s$. Then, $d_4$ can be computed as $d_4 = c_2 \oplus d_2 \oplus d_6$. Next, $d_5$ can be computed as $d_5 = d_4 \oplus s$. Finally, finally, $d_3 = d_1 \oplus d_5 \oplus c_1$. The result is that lost blocks $[d_3\ d_4]$ and $[d_5\ d_6]$ are fully recovered through the use of the redundant data blocks or parities, $[c_1\ c_2]$ and $[c_3\ c_4]$. Completion of the above-described decoding process for recovering all data blocks requires 10 XOR operations in this case. In particular, as shown above, computing S requires 3 XORs, computing $d_6$ requires 2 XORs, computing $d_4$ requires 2 XORs, computing $d_5$ requires 1 XOR, and computing $d_3$ requires 2 XORs for a total of 10 XORs.

2.3 Coding from a Matrix Perspective:

The encoding and decoding of any linear block codes using XOR operations can be represented in a matrix form. The following paragraphs generally describe encoding and decoding using a matrix format, and a technique referred to herein as "common operations first" (COF) to reduce the total number of required XOR operations through an evaluation of any linear block code represented in a matrix format. However, it should be noted that while the matrix format described below is useful for assisting in identifying common XOR operations, the code optimizer described herein is not intended to be limited to the use of matrices for identifying common XOR operations. In particular, the intent is to reduce the complexity of XOR based codes by eliminating some or all common XOR operations in either or both encoding and decoding of XOR based codes. The use of matrices is only one way of organizing the operations into a format from which common XOR operations can be easily identified.

2.3.1 Encoding from a Matrix Perspective Using COF:

As noted above, encoding of linear block codes using XOR operations can be represented in a matrix form. For example, given the (5, 3) EVENODD code described above, when encoding data, the data cells, D, are represented by data inputs $D=[d_1\ d_2\ d_3\ d_4\ d_5\ d_6]$, and the parity cells, C, are represented by coded outputs $C=[c_1\ c_2\ c_3\ c_4]$. Therefore, the encoding can be represented using matrices such that $C=D\times M_e$ where an "encoding matrix" $M_e$ takes the following form:

$$M_e = \begin{matrix} c_1 & c_2 & c_3 & c_4 \\ \begin{bmatrix} 1 & 0 & 1 & 0 \\ 0 & 1 & 0 & 1 \\ 1 & 0 & 0 & 1 \\ 0 & 1 & 1 & 1 \\ 1 & 0 & 1 & 1 \\ 0 & 1 & 1 & 0 \end{bmatrix} & \begin{matrix} d_1 \\ d_2 \\ d_3 \\ d_4 \\ d_5 \\ d_6 \end{matrix} \end{matrix} \quad \text{Equation (4)}$$

where identifiers $\{c_1\ c_2\ c_3\ c_4\}$ and $\{d_1\ d_2\ d_3\ d_4\ d_5\ d_6\}$ are added along the edge of the matrix $M_e$ to show how the each of the parities are computed from the data cells. For example, looking at the first column of the matrix, $c_1$ can be determined by computing $d_1 \oplus d_3 \oplus d_5$ (since $d_1$, $d_3$, and $d_5$ have non-zero entries in the first column). Note that $M_e$ represents only a portion of the codes generator matrix. Specifically, for systematic codes, the systematic part of the generator matrix is not changed, and as such, it can be ignored for purposes of explanation.

Given the encoding matrix sown in Equation (4), a brute force approach to compute the redundant (or parity) blocks is to simply XOR all data cells in a particular column of the matrix whenever the encoding matrix has non-zero entries. For example, applying this approach to the matrix of Equation (4) would provide the following sequence of XOR operations for computing the parity cells:

$$c_1 = d_1 \oplus d_3 \oplus d_5$$

$$c_2 = d_2 \oplus d_4 \oplus d_6$$

$$c_3 = d_1 \oplus d_4 \oplus d_5 \oplus d_6$$

$$c_4 = d_2 \oplus d_3 \oplus d_4 \oplus d_5 \quad \text{Equation (5)}$$

In this way, counting the total number of non-zeros entries yields the worst case encoding complexity, which in this case is 10 XOR operations as illustrated by Equation (5).

Note that if conventional EVENODD encoding (which requires 9 XOR operations, as described in Section 2.2) is mapped onto the matrix representation to provide the matrix illustrated in Equation (4), it is equivalent to computing $d_4 \oplus d_5$ only once (since the adjustor S is only calculated once, as described above). This saves 1 XOR operation relative to the brute force approach and exactly accounts for the difference between the matrix-based brute force approach (10 XORs) and conventional EVENODD encoding (9 XORs).

However, by closely examining the matrix of Equation (4) it is observed that several XORs are computed more than once. In other words, there are a number of shared XORs which can be computed once in order to further reduce the total number of operations. In particular, an examination of the matrix illustrated in Equation (4) shows that $d_2 \oplus d_4$ (denoted below as $d_{2,4}$) and $d_3 \oplus d_5$ (denoted below as $d_{3,5}$) are shared XORs. Therefore, the code optimizer adopts a rule to compute such common operations first (COF), such that $d_{2,4}$ and $d_{3,5}$ are computed first, with the results then being used to simplify the computations of $[c_1\ c_2\ c_3\ c_4]$ as illustrated by Equation 6, where:

$$d_{3,5} = d_3 \oplus d_5$$

$$d_{2,4} = d_2 \oplus d_4$$

$$c_1 = d_1 \oplus d_{3,5}$$

$$c_2 = d_{2,4} \oplus d_6$$

$$c_3 = d_1 \oplus d_4 \oplus d_5 \oplus d_6$$

$$c_4 = d_{2,4} \oplus d_{3,5} \quad \text{Equation (4)}$$

Clearly, by computing the COF first (i.e., $d_{2,4}$ and $d_{3,5}$) then using those results to replace corresponding or shared XOR operations, the total number of XORs is reduced to 8 operations, which is clearly less than the original EVENODD encoding which requires 9 XOR operations, and is less than the brute force approach that requires 10 XOR operations.

2.3.2 Decoding from a Matrix Perspective Using COF:

As noted above, decoding of linear block codes using XOR operations can be represented in a matrix form in the same manner as described above for encoding such codes. In fact, any XOR based code can be converted to a matrix format. For example, consider the same failure pattern described in Section 2.2 with respect to the (5, 3) EVENODD code, where the second and third data blocks are unavailable (i.e., assume that cells $[d_3\ d_4\ d_5\ d_6]$ are erasures).

It is straightforward to derive decoding equations from the encoding matrix $M_e$ (essentially performing matrix inversion) and obtain $D' = C' \times M_d$, where $D' = [d_3\ d_4\ d_5\ d_6]$, $C' = [d_1\ d_2\ c_1\ c_2\ c_3\ c_4]$, and the "decoding matrix" $M_d$ is given by Equation 7, where:

$$M_d = \begin{matrix} c_1 & c_2 & c_3 & c_4 \\ \begin{bmatrix} 0 & 1 & 1 & 1 \\ 1 & 1 & 1 & 0 \\ 1 & 1 & 0 & 1 \\ 1 & 0 & 1 & 1 \\ 1 & 0 & 1 & 0 \\ 0 & 1 & 0 & 1 \end{bmatrix} & \begin{matrix} d_1 \\ d_2 \\ d_3 \\ d_4 \\ d_5 \\ d_6 \end{matrix} \end{matrix} \quad \text{Equation (7)}$$

Clearly, the naive or brute force approach to computing $[c_1\ c_2\ c_3\ c_4]$ requires 12 XOR operations (again denoted by the symbol "$\oplus$") as follows:

$$c_1 = d_2 \oplus d_3 \oplus d_4 \oplus d_5$$

$$c_2 = d_1 \oplus d_2 \oplus d_3 \oplus d_6$$

$$c_3 = d_1 \oplus d_2 \oplus d_4 \oplus d_5$$

$$c_4 = d_1 \oplus d_3 \oplus d_4 \oplus d_6 \quad \text{Equation (8)}$$

However, an examination of the matrix illustrated in Equation (7) identifies several shared XOR operations in the matrix (e.g., $d_1 \oplus d_2$ is computed for both $c_2$ and $c_3$, $d_4 \oplus d_5$ is computed for both $c_1$ and $c_3$, and $d_3 \oplus d_6$ is computed for both $c_2$ and $c_4$). Therefore, by identifying these shared XOR operations, computing those shared XOR operations first and using the result to simplify subsequent XOR based computations, the code optimizer reduces the total number of required XOR operations from 12 XORs to 9 XORs, as follows:

$$d_{1,2}=d_1 \oplus d_2$$
$$d_{4,5}=d_4 \oplus d_5$$
$$d_{3,6}=d_3 \oplus d_6$$
$$c_1=d_2 \oplus d_3 \oplus d_{4,5}$$
$$c_2=d_{1,2} \oplus d_{3,6}$$
$$c_3=d_{1,2} \oplus d_{4,5}$$
$$c_4=d_1 \oplus d_4 \oplus d_{3,6} \quad \text{Equation (8)}$$

It should be noted that the 9 XOR operations illustrated in Equation (8) following application of the COF rule for reducing the number of XOR operations is also less than the corresponding conventional EVENODD decoding which requires 10 XOR operations, as described above in Section 2.2.

2.4 Optimization of a 2-Fault Tolerant Reed-Solomon Code:

Section 2.3 provided an example of optimizing a conventional (5, 3) EVENODD code to provide a new XOR based code having reduced complexity relative to the original EVENODD code. Similarly, the following paragraphs provide an example of applying the techniques enabled by the code optimizer to reduce the complexity of a conventional (5, 3) Reed-Solomon code for both encoding and decoding operations. As such, the following paragraphs will begin with a general discussion of conventional Reed-Solomon codes, and then describe how the techniques enabled by the code optimizer can be applied to reduce the complexity of such codes.

2.4.1 Isomorphism in Reed-Solomon Code:

As is well known to those skilled in the art, Reed-Solomon codes are generally constructed in finite fields, where the addition operation is simply XOR, but the multiplication operation is handled specially. Elements of finite fields can be represented using polynomials, which help to understand the addition and multiplication operations.

For example, consider a simple finite field with only 4 elements, which can be constructed taking polynomials modulo $x^2+x+1$. Since addition in this finite field is XOR, + and − operations provide the same result. Therefore, modulo $x^2+x+1$ can be computed simply as $x^2=x+1$. Therefore, since $x^3=xx^2$, and $x^2=x+1$ (for modulo $x^2+x+1$) as noted above, then $x^3=xx^2=x(x+1)=x^2+x=1$. Given this construction, it is easy to show that all polynomials can be represented using 4 basic elements, being 0, 1, x and x+1. As is known to those skilled in the art, given these elements, the addition and multiplication between any two pairs of XOR operations can be easily computed and stored in look-up tables. With the addition and multiplication tables, Reed-Solomon codes can be implemented using table-lookups, which is how they are often implemented in actual practice.

From the polynomial perspective, however, there is another way to represent the multiplication operation. For example, assume that it is desired to compute x(x+1). Instead of directly computing $x(x+1)=x^2+x=1$ (modulo $x^2+x=1$), a more general case can be considered by transforming the term into a form of (ax+b)(x+1), where in this case, a=1 and b=0. Therefore it can be shown that $(ax+b)(x+1)=a(x^2+x)+b(x+1)= a+b(x+1)$ (for modulo $x^2+x=1$).

Therefore, (ax+b)(x+1) can be represented as illustrated by Equation (9), where:

$$(ax+b)(x+1) = [a \ b] \begin{bmatrix} 0 & 1 \\ 1 & 1 \end{bmatrix} \quad \text{Equation (9)}$$

If a=1 and b=0, then Equation (9) simply returns x(x+1)=1. Similarly, if a=1 and b=1, then Equation (9) simply returns (x+1)(x+1)=x. Each of these examples can be easily verified using direct polynomial multiplications. These examples illustrate that multiplication in finite fields can be transformed into pure XOR operations. This conventional mechanism is known to those skilled in the art as isomorphism. The significance of this isomorphism concept is that a and b do not need to be a simple bit. In fact, a and b can be a byte, a word, 64 bits, 128 bits (with SSE/SSE2 instructions), or simply the maximal length a single XOR instruction can operate on. Consequently, as is known to those skilled in the art, the concept of isomorphism allows arbitrary codes defined on finite fields (not just Reed-Solomon codes) to be implemented using pure XOR operations.

2.4.2 Optimization of a 2-Fault Tolerant Reed-Solomon Code:

There are a number of conventional techniques for construct Reed-Solomon codes when there are no more than 3 redundant blocks. For example, to provide 2-fault tolerance for 3 data blocks (i.e., a (5, 3) Reed-Solomon code), the above described finite field of size 4 is used with the following encoding matrix:

$$[c_a \ c_b] = [d_a \ d_b \ d_c] \begin{bmatrix} 1 & 1 \\ 1 & x \\ 1 & x+1 \end{bmatrix} \quad \text{Equation (10)}$$

where $c_a$ and $c_b$ are redundant blocks and $d_a$, $d_b$, and $d_c$ are data blocks representing elements in the finite field. Let $c_a=c_1 x+c_2$, $d_a=d_1 x+d_2$, etc. Then, $c_1$, $c_2$, $d_1$, $d_2$, etc. are elements in binary, which leads to the following representation of a 2-fault tolerant Reed-Solomon code through isomorphism:

$$[c_1 \ c_2 \ c_3 \ c_4] = \quad \text{Equation (11)}$$

$$[d_1 \ d_2 \ d_3 \ d_4 \ d_5 \ d_6] \begin{bmatrix} 1 & 0 & 1 & 0 \\ 0 & 1 & 0 & 1 \\ 1 & 0 & 1 & 1 \\ 0 & 1 & 1 & 0 \\ 1 & 0 & 0 & 1 \\ 0 & 1 & 0 & 1 \end{bmatrix} \begin{matrix} d_1 \\ d_2 \\ d_3 \\ d_4 \\ d_5 \\ d_6 \end{matrix}$$

where identifiers $\{c_1 \ c_2 \ c_3 \ c_4\}$ and $\{d_1 \ d_2 \ d_3 \ d_4 \ d_5 \ d_6\}$ are added along the edge of the matrix to show how the each of the parities are computed from the data cells.

Applying the COF rule described in Section 2.3 to the matrix of Equation (11), it can be observed that $d_1 \oplus d_3$ and $d_4 \oplus d_6$ are shared XORs and should be computed first. This results in the following XOR operations:

$$d_{1,3}=d_1 \oplus d_3$$
$$d_{4,6}=d_4 \oplus d_6$$

$$c_1 = d_{1,3} \oplus d_5$$

$$c_2 = d_2 \oplus d_{4,6}$$

$$c_3 = d_{1,3} \oplus d_4$$

$$c_4 = d_2 \oplus d_3 \oplus d_5 \oplus d_6 \quad \text{Equation (12)}$$

where the total number of XORs is 8. This simple example shows that a simple (5, 3) Reed-Solomon code can be optimized to be more efficient than a conventional (5, 3) EVENODD encoding.

Similarly, it is straightforward to show that decoding the second and third data blocks requires 9 XORs, also less than the EVENODD decoding. Note that while in this particular example, the encoding and decoding matrices of the Reed-Solomon code happen to be the same as the EVENODD code. However, this is generally not true in most cases.

2.5 Optimizing Arbitrary XOR-Based Codes:

In Sections 2.2 and 2.2, use of the code optimizer for providing optimization of simple (5, 3) EVENODD and (5, 3) Reed-Solomon codes was described for purposes of explanation. However, as noted above, the optimization techniques enabled by the code optimizer are applicable for use in reducing the complexity of arbitrary XOR based codes, regardless of whether those codes are specially designed XOR based codes, or are simply isomorphisms of regular Reed-Solomon or other types of XOR based codes.

However, when an encoding matrix or decoding matrix becomes larger, with increased numbers of shared XOR operations, it becomes nontrivial to determine which shared XORs should be computed first and used as intermediate results for other XOR sequences. In fact, it should be noted that rather than compute every single shared XOR operation first, better results are achieved by determining a "best path" through different possible selections of shared XOR operations. Consequently, in one embodiment, this more general case for optimizing arbitrary XOR based codes is treated in the manner of an NP-complete problem that is solved using various embodiments.

2.5.1 Optimization Problem Formulation:

In general, optimizing arbitrary XOR based codes involves some or all of the following steps, depending upon the particular embodiment of the code optimizer:

1. Receive a set of inputs, denoted as $\{i_1, i_2, \ldots, i_{|I|}\}$, and a coding matrix M (either encoding or decoding) representing an arbitrary XOR based code;
2. Determine a set of all required outputs, denoted as $\{o_1, o_2, \ldots, o_{|O|}\}$, to be computed from the inputs and the coding matrix, where XORs are the only computation operation.
3. Identify XOR operations that are shared between two or more of the required outputs, $\{o_1, o_2, \ldots, o_{|O|}\}$.
4. Determine a set of one or more valid "computation paths", where a computation path is defined as a sequence of XOR operations involving the inputs and/or intermediate results from previous XORs of shared XOR operations (as described in further detail below). Note that a computation path is considered to be valid if it yields all required outputs, $\{o_1, o_2, \ldots, o_{|O|}\}$, after all XORs along the path are computed.
5. Determine a length of each valid computation path as a total number of XORs contained in the path.
6. Select a valid computation path having a minimum length as an optimized XOR based code.

Figure 2:
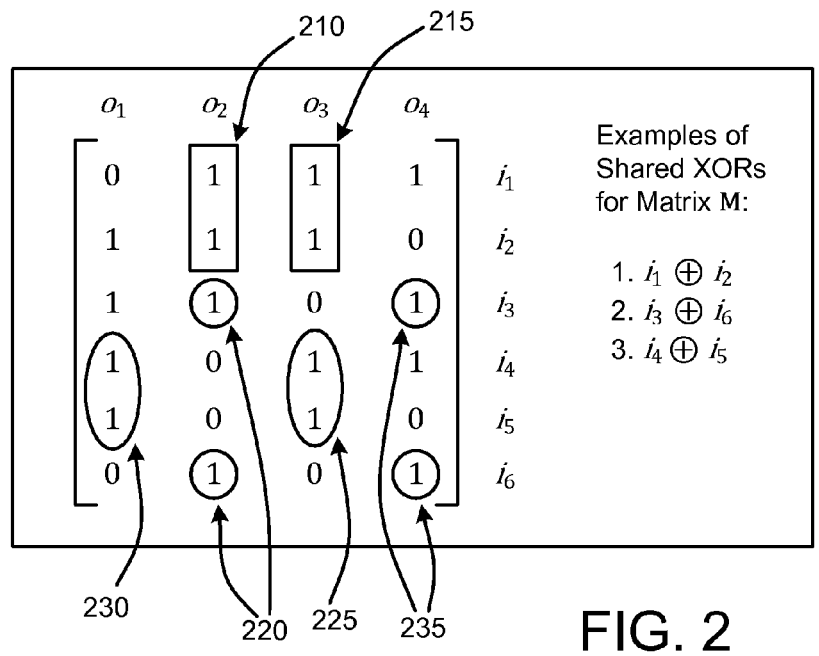
FIG. 2 illustrates an XOR based code matrix showing shared XORs, as described herein.

In one embodiment, selection of a valid computation path (Step 5) is treated as an NP-complete problem once the possible shared XORs have been identified. As illustrated by FIG. 2, shared XORs are identified by simply finding sequences of two or more XORs of inputs $\{i_1, i_2, \ldots, i_{|I|}\}$ in the matrix M that are used for computing a particular output $\{o_1, o_2, \ldots, o_{|O|}\}$. In particular, FIG. 2 shows three pairs of single XORs that are shared between two different outputs, with those shared XORs shown as being bordered by various shapes (rectangle (210, 215), circle (220, 225), and ellipse (230, 235)) for purposes of illustration. Note that while FIG. 2 specifically identifies only a single XOR for each shared XOR operation, it is possible for there to be more XORs for a shared operation. For example, an evaluation of the matrix illustrated in FIG. 2 shows that the XOR sequence $i_1 \oplus i_3 \oplus i_6$ is common outputs $o_2$ and $o_4$. Further, it should also be noted that a particular shared XOR may be common to more than two outputs; however, this case is not illustrated in FIG. 2.

For purposes of explanation, the concept of "covers" is used to represent shared XORs. While these covers are generally referred to in the following discussion as "rectangular covers," it should be noted that the pairs of corresponding or shared "rectangular covers" illustrated in FIG. 2 are shown as rectangles (210, 215), circles (220, 225), and ellipses (230, 235) so that they may be visually differentiated in FIG. 2.

In particular, the general conceptual of a rectangle cover (denoted below using the term "RC") is used to identify shared XORs. Each rectangle cover (RC) spans at least two rows (having a height of $h_{RC}$ corresponding to the number of rows covered) and at least two columns (having width of $w_{RC}$ corresponding to the number of columns covered) of the coding matrix. Note that an RC does not need to be contiguous in either rows or columns (see for example shared XOR $i_3 \oplus i_6$ illustrated by the "rectangular covers" shown as circles 220 and 235. Further, since the concept of a shared XOR implies that the XORs are then same for a particular output, any rectangle cover must contain the same number of entries among all rows (or columns). In addition, a rectangle cover can only contain 1's and no 0's at all (since only the 1's represent inputs that are to be used for XOR operations to compute a particular output). As such, all columns of a rectangle cover share same XORs. Therefore, computing any single column of a shared XOR is sufficient, with the total number of XORs required to compute that column being given by $h_{RC} - 1$.

As noted above, depending upon the size or complexity of the arbitrary XOR based code, there may be several or even many valid paths of XOR sequences for optimizing a particular XOR based code. Therefore, in one embodiment, a "cost" is associated with each rectangle cover, with that cost being denoted as $c_{RC}$, where:

$$c_{RC} = (h_{RC} - 1) + w_{RC} \quad \text{Equation (13)}$$

where $h_{RC} - 1$ accounts for the number XORs to be computed within the rectangle, and where $w_{RC}$ represents the number of columns (each column corresponding to a different output) covered by the RC. Finally, each complete set of i non-overlapping rectangle covers is denoted as $RC_i$, such that the rectangle covers of each complete set do not overlap with each other and cover all 1's of the coding matrix.

Given the terms and definitions described above, each valid computation path is represented by a set of non-overlapping complete rectangle covers ($RC_i$). As such, the length of each valid computation path is equal to the total cost of all rectangle covers in that path minus the number of outputs, O, such that the path cost, PC, for a particular path is given by Equation 14, where:

$$PC = \Sigma c_{RC_i} - |O| \quad \text{Equation (14)}$$

Given this formulation, the optimization problem can be considered to be equivalent to finding a set of non-overlapping complete rectangle covers of the coding matrix with the minimum total cost, where |O| is constant and thus can be ignored. However, given the possibility multiple valid paths, it is possible that some of the rectangular covers may overlap. Therefore, in various embodiments, the non-overlapping constraint is eliminated by modifying the cost function of rectangle covers.

In particular, in order to eliminate the non-overlapping rectangle cover constraint, a large constant L is added to the cost ($c_{RC_j}$) of each rectangle cover. Then, for the case of non-overlapping rectangle covers, the number of times that L is counted for the total cost for a particular valid computation path is equal to the number of 1's in the coding matrix. On the other hand, once two rectangle covers overlap, L will be counted more times. Therefore, as long as L is large enough (e.g., more than the total entries in the coding matrix, such that L>|I|×|O|), overlapping rectangle covers will never yield the minimum cost. Consequently, given this cost function, it is only necessary to identify a set of complete rectangle covers with a minimum total cost. The following sections describe various embodiments for finding approximate solutions to the minimization problem for arbitrary XOR based codes.

2.5.2 Cardinality Matching Based Optimization:

For purposes of explanation, the coding matrix illustrated in FIG. 2 will be used to describe the concept of cardinality matching for XOR based code optimization. However, as noted above, the techniques described herein apply to optimization of arbitrary XOR based codes.

In particular, as illustrated in FIG. 2, the coding matrix inputs include $\{i_1, i_2, i_3, i_4, i_5, i_6\}$, while the matrix outputs include $\{o_1, o_2, o_3, o_4\}$. Based on this coding matrix, in order to compute $o_1$, four XOR inputs $\{i_2, i_3, i_4, i_5\}$ are required. Specifically, as can be seen from the leftmost column of the coding matrix of FIG. 2, $o_1 = i_2 \oplus i_3 \oplus i_4 \oplus i_5$. However, given the nature of XOR operations, there are many ways that $o_1$ can be computed. For instance, $i_2 \oplus i_3$ can first be computed, followed by a computation of $\oplus i_4 \oplus i_5$, with the two results then being XOR'd in a third computation. Similarly, $i_2 \oplus i_3$ can be computed, with the result then being XOR's with $i_4$, with the result of that computation then being XOR'd with $i_5$. In either case, the end result of the computations is exactly the same so long as all of the inputs are XOR'd in any order desired.

Figure 3:
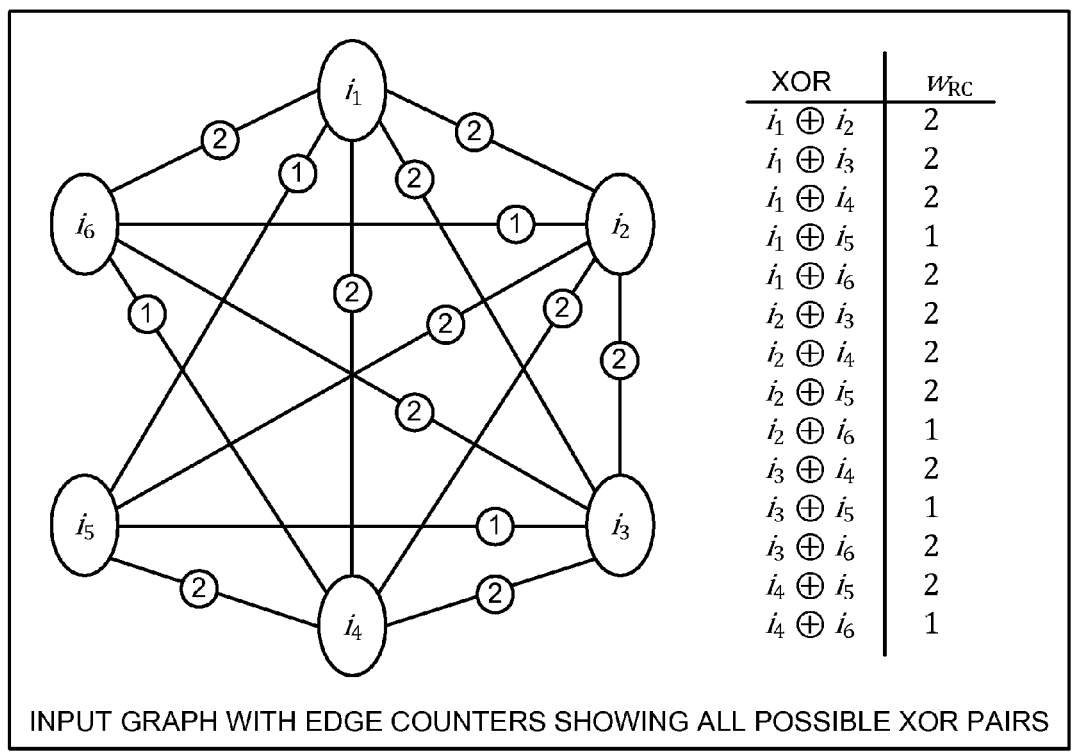
FIG. 3 illustrates a graph with edge counters for use in determining an optimal XOR operation path for reducing the complexity of XOR based codes, as described herein.

FIG. 3 shows an edge graph that lists all possible XOR pairs (e.g., $i_1 \oplus i_2$, $i_2 \oplus i_3$, etc.) that can be computed over the matrix of FIG. 2. Specifically, to show all possibilities, each input $\{i_1, i_2, i_3, i_4, i_5, i_6\}$ is shown as a node in the graph of FIG. 3, and a connection between nodes is shown as an edge whenever there is a potential XOR computation. Clearly, between any two-node pair among the inputs $\{i_2, i_3, i_4, i_5\}$, there exists an edge. Hence, the graph contains a group of four inputs for the computation of $o_1$. Similarly, for other outputs $\{o_2, o_3, o_4\}$, the graph will contain different groups of inputs.

Putting all groups of inputs corresponding to each of the outputs into the same graph, some edges belong only to one group, while others belong to multiple groups (due to shared XORs). To address this issue, a counter is shown on each edge to indicate the number of groups that each edge belongs to. Intuitively, these edge counters represent how many times one particular XOR is shared during the computation of different outputs (which also corresponds to the aforementioned number of columns covered, $w_{RC}$).

Figure 4:
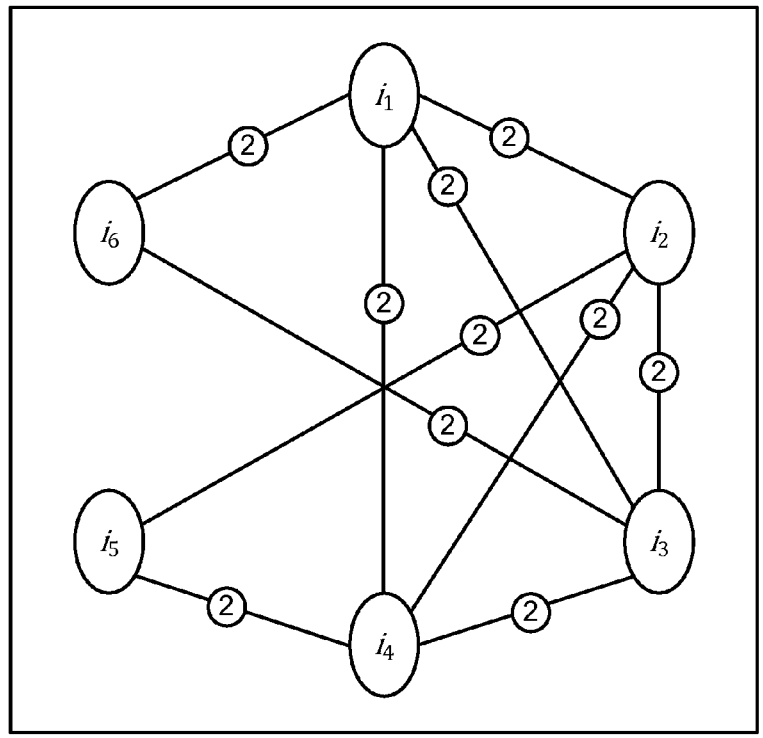
FIG. 4 illustrates a graph with edge counters for use in determining an optimal XOR operation path using a cardinality matching embodiment for reducing the complexity of XOR based codes, as described herein.

As noted above, to reduce the total number of operations shared XORs are computed first, thereby reducing the complexity of the XOR based code. In terms of the graph, edges having the highest counter value are the most shared, and thus are more likely to lead to a reduction in complexity when computed first, with the results of such computations then being used to simplify subsequent computations. For example, FIG. 3 shows the complete graph and edge counters corresponding to the coding matrix of FIG. 2. The highest edge counter for this particular graph is 2. To compute such edges first, all edges with lower counter values are removed to generate a sub-graph as illustrated in FIG. 4.

Next, the maximum number of disjoint edges (where no two edges share the same node) are identified, with the corresponding XORs then being computed first. The rationale here is that disjoint edges represent XORs on completely different nodes, and computing them at the same time does not affect any of the other XOR computations. Determining and identifying the maximum number of disjoint edges provides a maximum reduction of XOR operations.

Note that the concept of finding the maximum number of disjoint edges is a well-studied graph theory problem known as "maximum cardinality matching." In particular, a "matching" provides a set of edges in a graph, where there are no two edges that share the same node. A "maximum matching" is a matching having the maximum number of edges. Given an arbitrary graph, such as the graph shown in FIG. 4, there are a number of conventional search algorithms that can be used to find a maximum matching.

Further, it should be noted that there may be multiple maximal matchings (same maximum number of disjoint edges) in any particular graph. The code optimizer simply selects any one of these maximal matchings for use in optimizing the XOR based code. For example, as illustrated by FIG. 4, there are at least three equivalent maximal matchings, including:

1. $\{i_1, i_2\}$, $\{i_3, i_6\}$, and $\{i_4, i_5\}$;
2. $\{i_1, i_4\}$, $\{i_2, i_5\}$, and $\{i_3, i_5\}$; and
3. $\{i_1, i_6\}$, $\{i_2, i_5\}$, and $\{i_3, i_4\}$;

Specifically, assuming selection of the first maximal matching identified above, the XORs corresponding to the selected maximal matching are computed first. Therefore, the code optimizer will first compute $i_1 \oplus i_2$, $i_3 \oplus i_6$, and $i_4 \oplus i_5$. Then, once these XORs are computed, the remaining XOR are examined to determine which still need to be computed and how they can be further simplified based on the already computed XORs.

In particular, a new matrix representing all the XORs is constructed from the original coding matrix, where entries corresponding to XORs which have already been computed are removed, with new entries being added for the "intermediate results" from the above computations (i.e., the intermediate results correspond to the results of the computations of $i_1 \oplus i_2$, $i_3 \oplus i_6$, and $i_4 \oplus i_5$). To construct this new matrix, three "imaginary inputs," $i_{1,2}$, $i_{3,6}$, and $i_{4,5}$ are used to represent the three intermediate results. As such, the new coding matrix, M' becomes:

$$M' = \begin{bmatrix} o_1 & o_2 & o_3 & o_4 \\ 0 & 1 \to 0 & 1 \to 0 & 1 \\ 1 & 1 \to 0 & 1 \to 0 & 0 \\ 1 & 1 \to 0 & 0 & 1 \to 0 \\ 1 \to 0 & 0 & 1 \to 0 & 1 \\ 1 \to 0 & 0 & 1 \to 0 & 0 \\ 0 & 1 \to 0 & 0 & 1 \to 0 \\ 0 & 1 & 1 & 0 \\ 0 & 1 & 0 & 1 \\ 1 & 0 & 1 & 0 \end{bmatrix} \begin{bmatrix} i_1 \\ i_2 \\ i_3 \\ i_4 \\ i_5 \\ i_6 \\ i_{1,2} \\ i_{3,6} \\ i_{4,5} \end{bmatrix} = \begin{bmatrix} o_1 & o_2 & o_3 & o_4 \\ 0 & 0 & 0 & 1 \\ 1 & 0 & 0 & 0 \\ 1 & 0 & 0 & 0 \\ 0 & 0 & 0 & 1 \\ 0 & 0 & 0 & 0 \\ 0 & 0 & 0 & 0 \\ 0 & 1 & 1 & 0 \\ 0 & 1 & 0 & 1 \\ 1 & 0 & 1 & 0 \end{bmatrix} \quad \text{Equation (15)}$$

where the three bottom rows are newly added to create the new coding matrix, M'.

Then, using the second column as an example, there a non-zero entries for both $i_{1,2}$ and $i_{3,6}$. This corresponds to $o_2 = i_{1,2} \oplus i_{3,6}$, which is the same as the original computation of $o_2 = i_1 \oplus i_2 \oplus i_3 \oplus i_6$. In particular, given the new coding matrix M' illustrated in Equation (15), the following XORs represent the optimized XOR code (having a total of 8 XORS) based on the original coding matrix illustrated in FIG. 2 (which would have required a total of 12 XORs prior to optimization):

$i_{1,2} = i_1 \oplus i_2$ $i_{3,6} = i_3 \oplus i_6$ $i_{4,5} = i_4 \oplus i_5$ $o_1 = i_2 \oplus i_3 \oplus i_{4,5}$ $o_2 = i_{1,2} \oplus i_{3,6}$ $o_3 = i_{1,2} \oplus i_{4,5}$ $o_4 = i_1 \oplus i_4 \oplus i_{3,6}$ \quad Equation (16)

It should be noted that depending upon the entries in the new coding matrix, it is possible that there will be additional shared XOR operations (however, this is not the case with the exemplary matrix illustrated in Equation (15)). Consequently, in one embodiment, the code optimizer processes the new coding matrix in the same manner as the original coding matrix to identify shared XORs which are then computed first (and thus only once) and then used to simplify subsequent XOR sequences. In particular, in various embodiments, the same procedure described above is again used to find the maximum number of shared XORs in the new coding matrix, with that process then being iteratively repeated until there are no more shared XORs. Clearly, this iterative process will automatically terminate after a finite number of rounds as soon as there are no more matching or shared XORs, with a further reduction in the number of total XORs being achieved in each iteration.

2.5.3 Weighted Matching Based Optimization:

As noted above, there may be multiple maximum matchings in a particular graph. For example, as discussed above with respect to FIG. 4, there are at least three equivalent maximum matchings, including:

1. $\{i_1, i_2\}$, $\{i_3, i_6\}$, and $\{i_4, i_5\}$;
2. $\{i_1, i_4\}$, $\{i_2, i_5\}$, and $\{i_3, i_5\}$; and
3. $\{i_1, i_6\}$, $\{i_2, i_5\}$, and $\{i_3, i_4\}$;

In the cardinality matching based optimization approach described in Section 2.5.2, the code optimizer simply selected any one of the identified maximum matchings. However, it is possible that a randomly selected one of the identified maximum matchings will not necessarily result in the best optimization of the arbitrary XOR based code. Therefore, in further embodiments, the code optimizer provides a variation of the cardinality matching based optimization approach as described in the following paragraphs.

In general, in what is referred to as "weighted matching based optimization," the code optimizer still identifies each of the maximum matchings (i.e., the maximum number of disjoint pairs), as described above. However, in contrast to the technique described above, the idea here is to cover as few "dense" nodes as possible, where the density of a node is defined by its "degree." Note that the degree of a particular node is simply the number of edges entering that node. For example, the "degree" of node $i_1$ is 5, while the degree of node $i_6$ is 4. The general concept here is that is that if all nodes covered by a maximum matching are removed, as well as all the edges connected to these nodes, then the remaining graph will be more dense, such that it is likely to contain more matchings for the next round of match identifications, thereby allowing further reductions in total number of XOR operations for the final optimized XOR based code.

Figure 5:
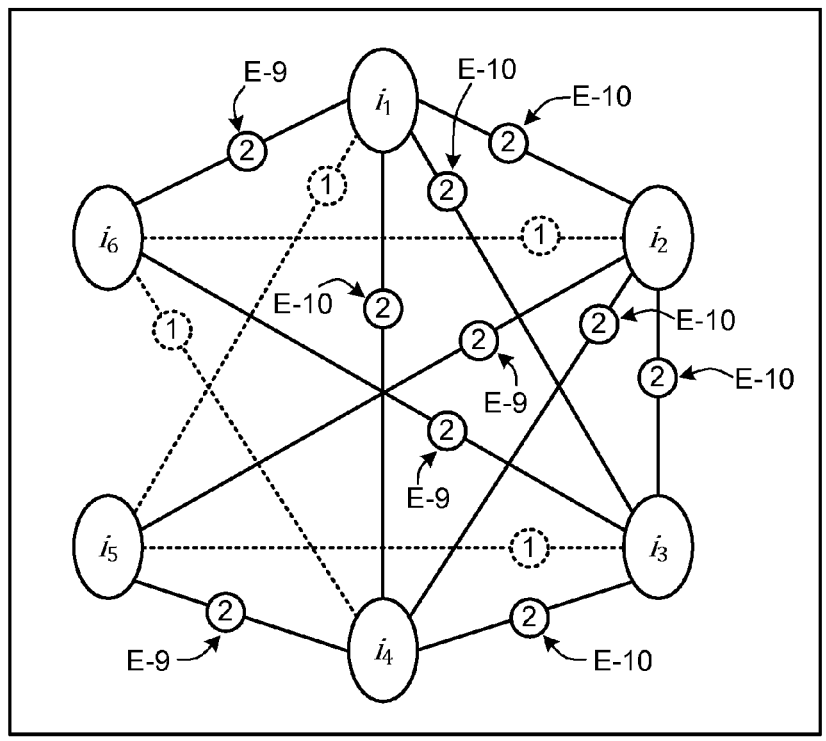
FIG. 5 illustrates a graph with weighted edge counters for use in determining an optimal XOR operation path using a weighted matching embodiment for reducing the complexity of XOR based codes, as described herein.

Specifically, the weighted matching based optimization approach differs, in part, from the cardinality based approach described in Section 2.5.2 in that maximum matchings are identified in a different manner. In particular, starting from the original graph shown in FIG. 3, weights are assigned to all edges having the maximum edge or counter value (which in the case of FIG. 3 is a value of 2), its weight is set to be a large constant, E, minus the sum of the degrees of the two end nodes to which a particular edge is connected. Edges having a counter value less than the maximum value are excluded from this weighting process. For example, as noted above, the degree of node $i_1$ is 5, and the degree of node $i_6$ is 4. Therefore, the "weight" assigned to the edge between node $i_1$ and $i_6$ is E−(5+4)=E−9. In accordance with this framework, each of the edge weights are illustrated in FIG. 5, where the edges having a counter value of less than 2 are shown in broken lines and are not weighted.

Then, once all of the edges have been weighted, the code optimizer identifies one or more maximum weighted matchings by summing the weighted counter values of each of the corresponding edges. Note that setting the value of E to be at least equal to the sum of the degrees of all nodes will insure that that the maximum weighted matchings will always contain the maximum number of matching pairs (i.e., also a maximum cardinality matching). Note that in the case of FIG. 5, each of the three possible matchings discussed above with respect to FIG. 4 have the same weight, and thus any of the three can be selected. However, this is generally not the case with more complex XOR based codes.

Finally, once the maximum weighted matching has been selected, the process continues in the same manner as described above in Section 2.5.2 for computing the shared XORs first and using the results for reducing the complexity of subsequent XOR operations to create a new coding matrix, M' as described above with respect to Equation (15).

2.6 Performance and Practicality Considerations:

As noted above, some or all optimum XOR computation paths may either be computed offline and stored for use as needed, or can be computed at runtime on an as needed basis. These options hold for both encoding and decoding operations. For encoding, there is only one computation path to store, as such, it is generally more efficient to compute and store this optimized XOR based code prior to run time. On the other hand, for decoding, the number of paths to be stored can be potentially very large, with one unique computation path for every possible erasure pattern).

To alleviate any storage overhead required to store optimized decoding paths, there are several options. For example, when code redundancy is fairly limited (e.g., a 2 or 3-fault-tolerant XOR based code), the total number of paths is generally not too large. Consequently, in such cases, it may be more efficient to store all possible decoding paths to account for every possible erasure pattern.

On the other hand, as the level of redundancy increases, the number of possible failure paths increases rapidly, with a corresponding increase in the total number of possible decoding paths. In this case, it may be more efficient to pre-compute and store the optimized decoding paths corresponding to what are considered to be some of the more likely erasure patterns. When any of these expected erasure patterns are observed, the corresponding decoding computation path is simply retrieved and used to recover the data. Further, if any erasure patterns are observed for which an optimized decoding path has not been pre-computed, that path can be computed at decoding time, if desired. Alternately, since unexpected erasure patterns are not expected to be as common as likely erasure patterns, a simple brute force decoding using the non-optimized decoding matrix can always used for such cases in combination with the stored decoding patterns.

Figure 6:
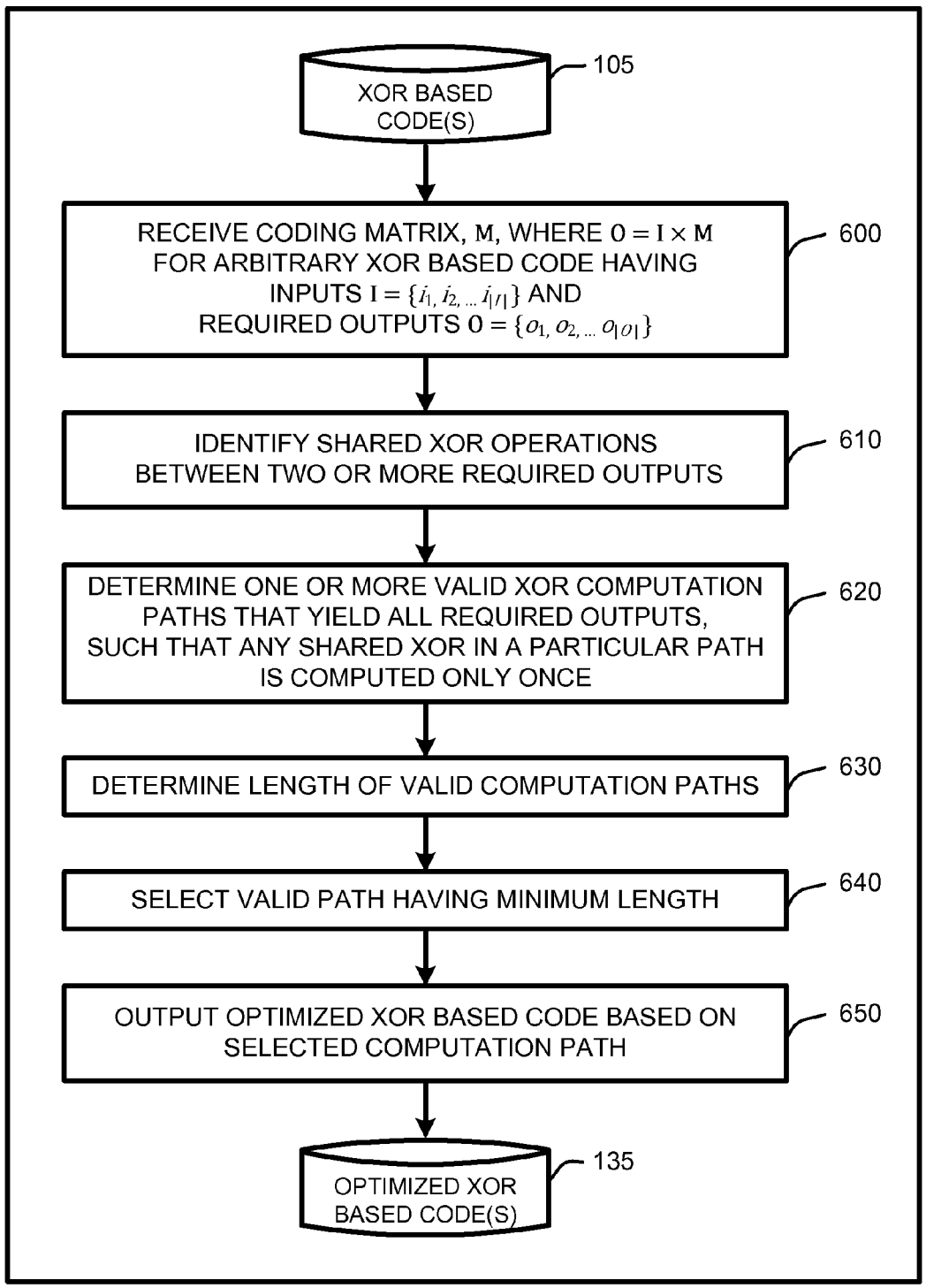
FIG. 6 illustrates a general flow diagram that illustrates exemplary methods for implementing various embodiments of the code optimizer, as described herein.

3.0 Operational Summary of the Code Optimizer:

The processes described above with respect to FIG. 1 through FIG. 5 and in further view of the detailed description provided above in Sections 1 and 2 are illustrated by the general operational flow diagram of FIG. 6. In particular, FIG. 6 provides an exemplary operational flow diagram which illustrates operation of several embodiments of the code optimizer. Note that FIG. 6 is not intended to be an exhaustive representation of all of the various embodiments of the code optimizer described herein, and that the embodiments represented in FIG. 6 are provided only for purposes of explanation.

Further, it should be noted that any boxes and interconnections between boxes that are represented by broken or dashed lines in FIG. 6 represent optional or alternate embodiments of the code optimizer described herein, and that any or all of these optional or alternate embodiments, as described below, may be used in combination with other alternate embodiments that are described throughout this document.

In general, as illustrated by FIG. 6, the code optimizer begins operation by receiving 600 a coding matrix M for an arbitrary XOR based code 105. As discussed above, the coding matrix M is used in combination with a set of inputs, $\{i_1, i_2, \ldots, i_{|I|}\}$, and to determine a set of all outputs, $\{o_1, o_2, \ldots, o_{|O|}\}$, required for satisfying any redundancy associated with the arbitrary XOR based code 105. Note that as discussed above, any arbitrary XOR based code 105 can be converted into a matrix format, so that if the code is not received in a matrix format, it is simply converted to a matrix format.

Next, given the coding matrix M, the coding optimizer evaluates the matrix to identify 610 one or more shared XOR operations between two or more of the required outputs, as discussed above. Once the shared XOR operations have been identified 610, the coding optimizer determines 620 one or more valid computation paths. As discussed above, each individual computation path represents a sequence of XOR operations that yields all required outputs, $\{o_1, o_2, \ldots, o_{|O|}\}$, after all XORs along the path are computed. Further, as discussed above, each path makes use of shared XOR operations such that shared XORs are only computed once, with the result then being added to a particular path in place of the corresponding shared XOR in that computation path.

Once the coding optimizer has determined 620 each of the valid computation paths, the coding optimizer continues operation by determining 630 a total length (in terms of total number of XOR operations) required to compute each path. The path having the shortest length is inherently the most efficient path since it requires the smallest number of XOR operations. Therefore the coding optimizer simply selects the shortest valid coding path. However, in various embodiments, as discussed above, if there is more than one path having the same shortest length, the coding optimizer selects 640 one of the paths (either randomly, or based on path weights).

In either case, once the shortest valid path has been selected 640, that coding path is used to output 650 the optimized XOR based code 135. Note that since each valid coding path includes all XOR operations needed to compute all required outputs $\{o_1, o_2, \ldots, o_{|O|}\}$, the selected valid path is itself a version of the optimized XOR based code 135. As such, in outputting 650 the optimized XOR based code 135, the code optimizer simply stores the optimized XOR based code in whatever coding format is desired.

Figure 7:
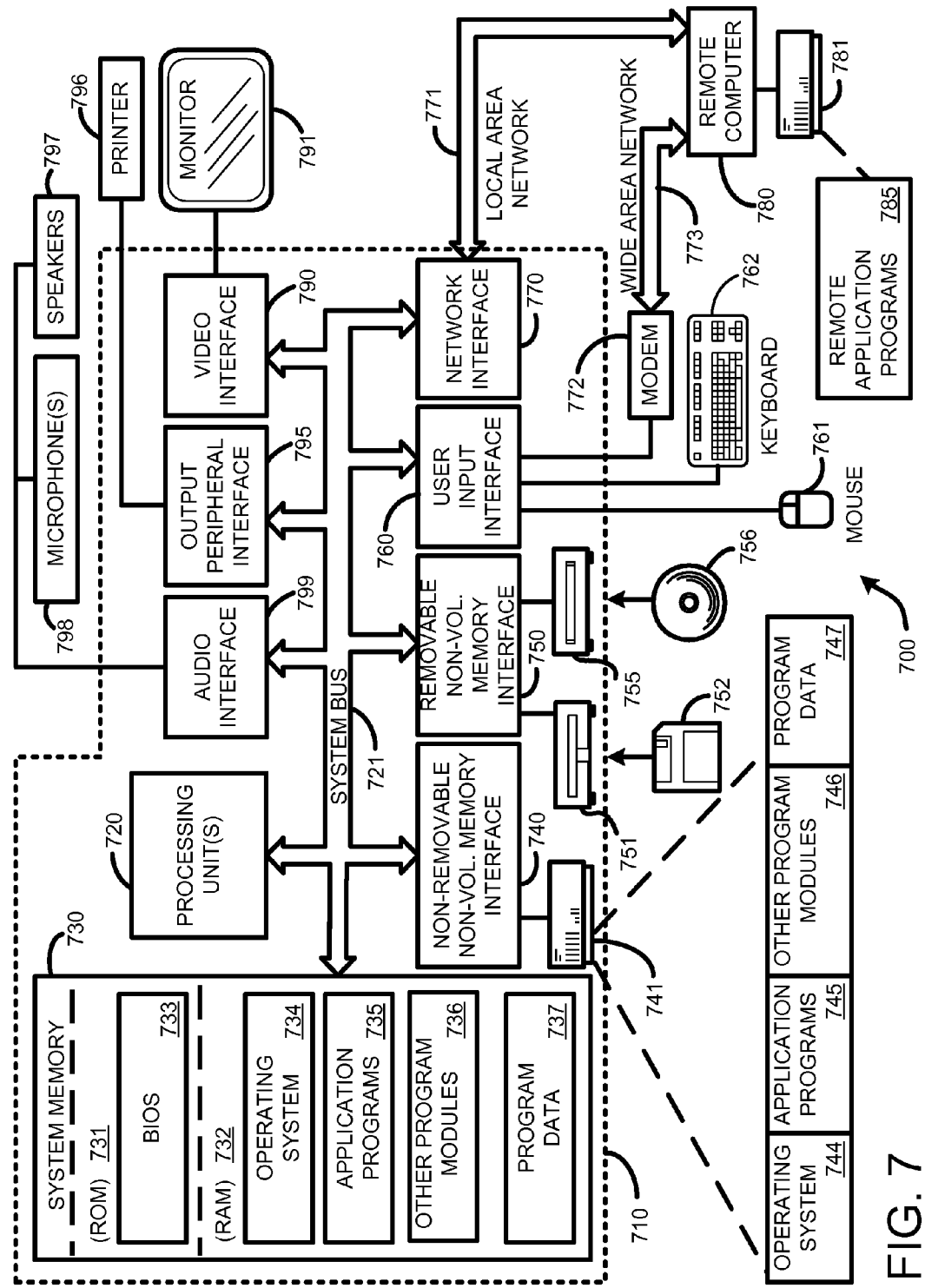
FIG. 7 is a general system diagram depicting a general-purpose computing device constituting an exemplary system for implementing various embodiments of the code optimizer, as described herein.
Figure 8:
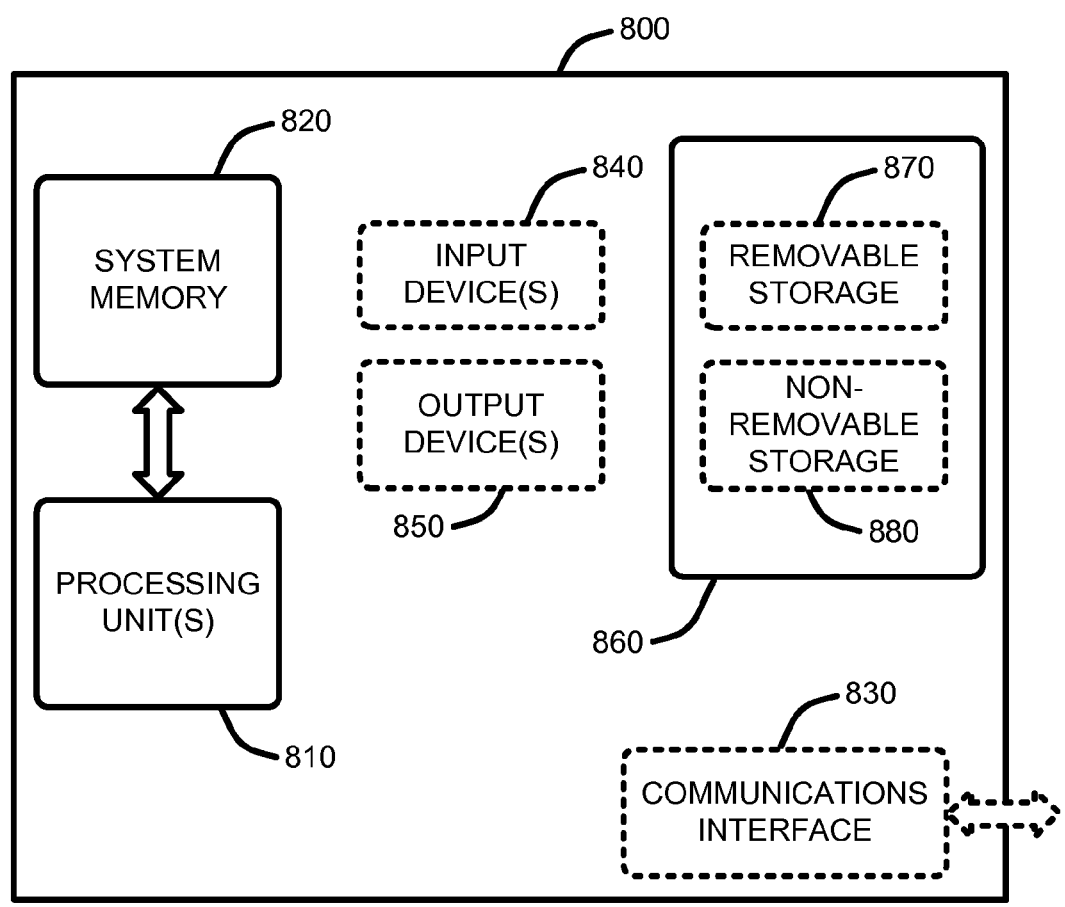
FIG. 8 is a general system diagram depicting a general computing device having simplified computing and I/O capabilities for use in implementing various embodiments of the code optimizer, as described herein.

4.0 Exemplary Operating Environments:

FIG. 7 and FIG. 8 illustrate two examples of suitable computing environments on which various embodiments and elements of a code optimizer, as described herein, may be implemented.

For example, FIG. 7 illustrates an example of a suitable computing system environment 700 on which the invention may be implemented. The computing system environment 700 is only one example of a suitable computing environment and is not intended to suggest any limitation as to the scope of use or functionality of the invention. Neither should the computing environment 700 be interpreted as having any dependency or requirement relating to any one or any combination of the components illustrated in the exemplary operating environment 700.

The invention is operational with numerous other general purpose or special purpose computing system environments or configurations. Examples of well known computing systems, environments, and/or configurations that may be suitable for use with the invention include, but are not limited to, personal computers, server computers, hand-held, laptop or mobile computer or communications devices such as cell phones and PDA's, multiprocessor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer in combination with hardware modules, including components of a microphone array 798. Generally, program modules include routines, programs, objects, components, data structures, etc., that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices. With reference to FIG. 7, an exemplary system for implementing the invention includes a general-purpose computing device in the form of a computer 710.

Components of computer 710 may include, but are not limited to, a processing unit 720, a system memory 730, and a system bus 721 that couples various system components including the system memory to the processing unit 720. The system bus 721 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 710 typically includes a variety of computer readable media. Computer readable media can be any available media that can be accessed by computer 710 and includes both volatile and nonvolatile media, removable and non-removable media. By way of example, and not limitation, computer readable media may comprise computer storage media such as volatile and nonvolatile removable and non-removable media implemented in any method or technology for storage of information such as computer readable instructions, data structures, program modules, or other data.

For example, computer storage media includes, but is not limited to, storage devices including RAM, ROM, PROM, EPROM, EEPROM, flash memory, or other memory technology; CD-ROM, digital versatile disks (DVD), or other optical disk storage; magnetic cassettes, magnetic tape, magnetic disk storage, or other magnetic storage devices; and the like; or any other medium which can be used to store the desired information and which can be accessed by computer 710.

The system memory 730 includes computer storage media in the form of volatile and/or nonvolatile memory such as read only memory (ROM) 731 and random access memory (RAM) 732. A basic input/output system 733 (BIOS), containing the basic routines that help to transfer information between elements within computer 710, such as during start-up, is typically stored in ROM 731. RAM 732 typically contains data and/or program modules that are immediately accessible to and/or presently being operated on by processing unit 720. By way of example, and not limitation, FIG. 7 illustrates operating system 734, application programs 735, other program modules 736, and program data 737.

The computer 710 may also include other removable/non-removable, volatile/nonvolatile computer storage media. By way of example only, FIG. 7 illustrates a hard disk drive 741 that reads from or writes to non-removable, nonvolatile magnetic media, a magnetic disk drive 751 that reads from or writes to a removable, nonvolatile magnetic disk 752, and an optical disk drive 755 that reads from or writes to a removable, nonvolatile optical disk 756 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 741 is typically connected to the system bus 721 through a non-removable memory interface such as interface 740, and magnetic disk drive 751 and optical disk drive 755 are typically connected to the system bus 721 by a removable memory interface, such as interface 750.

The drives and their associated computer storage media discussed above and illustrated in FIG. 7, provide storage of computer readable instructions, data structures, program modules and other data for the computer 710. In FIG. 7, for example, hard disk drive 741 is illustrated as storing operating system 744, application programs 745, other program modules 746, and program data 747. Note that these components can either be the same as or different from operating system 734, application programs 735, other program modules 736, and program data 737. Operating system 744, application programs 745, other program modules 746, and program data 747 are given different numbers here to illustrate that, at a minimum, they are different copies. A user may enter commands and information into the computer 710 through input devices such as a keyboard 762 and pointing device 761, commonly referred to as a mouse, trackball, or touch pad.

Other input devices (not shown) may include a joystick, game pad, satellite dish, scanner, radio receiver, and a television or broadcast video receiver, or the like. These and other input devices are often connected to the processing unit 720 through a wired or wireless user input interface 760 that is coupled to the system bus 721, but may be connected by other conventional interface and bus structures, such as, for example, a parallel port, a game port, a universal serial bus (USB), an IEEE 1394 interface, a Bluetooth™ wireless interface, an IEEE 802.11 wireless interface, etc. Further, the computer 710 may also include a speech or audio input device, such as a microphone or a microphone array 798, as well as a loudspeaker 797 or other sound output device connected via an audio interface 799, again including conventional wired or wireless interfaces, such as, for example, parallel, serial, USB, IEEE 1394, Bluetooth™, etc.

A monitor 791 or other type of display device is also connected to the system bus 721 via an interface, such as a video interface 790. In addition to the monitor, computers may also include other peripheral output devices such as a printer 796, which may be connected through an output peripheral interface 795.

The computer 710 may operate in a networked environment using logical connections to one or more remote computers, such as a remote computer 780. The remote computer 780 may be a personal computer, a server, a router, a network PC, a peer device, or other common network node, and typically includes many or all of the elements described above relative to the computer 710, although only a memory storage device 781 has been illustrated in FIG. 7. The logical connections depicted in FIG. 7 include a local area network (LAN) 771 and a wide area network (WAN) 773, but may also include other networks. Such networking environments are commonplace in offices, enterprise-wide computer networks, intranets, and the Internet.

When used in a LAN networking environment, the computer 710 is connected to the LAN 771 through a network interface or adapter 770. When used in a WAN networking environment, the computer 710 typically includes a modem 772 or other means for establishing communications over the WAN 773, such as the Internet. The modem 772, which may be internal or external, may be connected to the system bus 721 via the user input interface 760, or other appropriate mechanism. In a networked environment, program modules depicted relative to the computer 710, or portions thereof, may be stored in the remote memory storage device. By way of example, and not limitation, FIG. 7 illustrates remote application programs 785 as residing on memory device 781. It will be appreciated that the network connections shown are exemplary and other means of establishing a communications link between the computers may be used.

With respect to FIG. 8, this figure shows a general system diagram showing a simplified computing device. Such computing devices can be typically be found in devices having at least some minimum computational capability in combination with a communications interface, including, for example, cell phones PDA's, dedicated media players (audio and/or video), etc. It should be noted that any boxes that are represented by broken or dashed lines in FIG. 8 represent alternate embodiments of the simplified computing device, and that any or all of these alternate embodiments, as described below, may be used in combination with other alternate embodiments that are described throughout this document.

At a minimum, to allow a device to implement the code optimizer, the device must have some minimum computational capability, and some memory or storage capability. In particular, as illustrated by FIG. 8, the computational capability is generally illustrated by processing unit(s) 810 (roughly analogous to processing units 720 described above with respect to FIG. 7). Note that in contrast to the processing unit(s) 720 of the general computing device of FIG. 7, the processing unit(s) 810 illustrated in FIG. 8 may be specialized (and inexpensive) microprocessors, such as a DSP, a VLIW, or other micro-controller rather than the general-purpose processor unit of a PC-type computer or the like, as described above.

In addition, the simplified computing device of FIG. 8 may also include other components, such as, for example one or more input devices 840 (analogous to the input devices described with respect to FIG. 7). The simplified computing device of FIG. 8 may also include other optional components, such as, for example one or more output devices 850 (analogous to the output devices described with respect to FIG. 7). Finally, the simplified computing device of FIG. 8 also includes storage 860 that is either removable 870 and/or non-removable 880 (analogous to the storage devices described above with respect to FIG. 7).

The foregoing description of the code optimizer has been presented for the purposes of illustration and description. It is not intended to be exhaustive or to limit the invention to the precise form disclosed. Many modifications and variations are possible in light of the above teaching. Further, it should be noted that any or all of the aforementioned alternate embodiments may be used in any combination desired to form additional hybrid embodiments of the code optimizer. It is intended that the scope of the invention be limited not by this detailed description, but rather by the claims appended hereto.

What is claimed is:

1. A method for optimizing a coding operation of arbitrary EVENODD erasure correcting codes, comprising using a computing device for:
   receiving an EVENODD erasure correcting code;
      determining all XOR operations required to compute all required erasure correcting code outputs from two or more code inputs;
      evaluating the XOR operations to identify a set of one or more shared XOR operations, where each shared XOR operation represents an XOR operation performed on two or more common code inputs which is used for computing two or more different erasure correcting code outputs;
      computing a result of each shared XOR operation of the set of one or more shared XOR operations; and
      constructing an optimized version of the EVENODD erasure correcting code by using the computed result of each shared XOR operation to replace all corresponding XOR operations for computing the two or more different erasure correcting code outputs.

2. The method of claim 1 wherein the erasure correcting code comprises a set of coding operations, and wherein determining all XOR operations required to compute all required erasure correcting code outputs from the code inputs further comprises:
   transforming the coding operations of the erasure correcting code into a matrix format; and
   evaluating the matrix to identify XOR operations of two or more of the code inputs that are common to two or more of the outputs.

3. The method of claim 2, wherein a set of commonly occurring erasure patterns are pre-computed, and wherein a resulting matrix of each corresponding decode operation of each of the erasure patterns is optimized and cached in memory.

4. The method of claim 1 further comprising constructing a graph having nodes and edges between two or more of the nodes;
   wherein each node represents a different one of the code inputs;
   wherein each edge corresponds to an XOR operation of the inputs represented by the node on each end of the edge; and
   further comprising assigning an edge counter value to each edge, said edge counter value representing a number times that the corresponding XOR operation is required to compute all required erasure correcting code outputs.

5. The method of claim 4 wherein evaluating the XOR operations to identify the set of one or more shared XOR operations further comprises:
   removing all edges from the graph having an edge counter value that is less than a maximum of the all edge counter values of the graph;
   evaluating the remaining edges and identifying one or more maximal matchings of edges in the graph;
   selecting one of the identified maximal matchings of edges; and
   identifying XOR operations corresponding to all of the edges in the selected maximal matching of edges as the set of one or more shared XOR operations.

6. The method of claim 5 further comprising:
   for each node, counting a total number of edges entering each node prior to removal of the edges; and
   after removal of the edges, assigning an edge weight to each remaining edge as a function of a sum of the total number of edges that entered each of the two nodes on either end of each corresponding edge.

7. The method of claim 6 wherein selecting one of the identified maximal matchings of edges further comprises selecting the maximal matching of edges having a highest total weight based on a sum of the corresponding edge weights.

8. A process for reducing a total number of XOR operations in an arbitrary erasure correcting code, comprising using a computing device to perform steps for:
   receiving a binary matrix representing an erasure correcting code, said matrix including a non-zero value in each corresponding location of the matrix whenever a particular matrix input is required to compute a particular matrix output;
   wherein computing each of the matrix outputs involves performing an XOR operation between all matrix inputs having a corresponding non-zero value in the matrix for the particular matrix output being computed;
   searching the matrix to identify a set of one or more shared XOR operations wherein a shared XOR operation is an XOR operation between any two common matrix inputs that is required to compute two or more different matrix outputs;
   constructing a graph having nodes and edges between two or more of the nodes;
      wherein each node represents a different one of the matrix inputs;

wherein each edge corresponds to an XOR operation of the matrix inputs represented by the node on each end of the edge;

assigning an edge counter value to each edge, said edge counter value representing a number times that the corresponding XOR operation is required to compute all of the matrix outputs; and constructing an optimized coding matrix by replacing each shared XOR operation with a corresponding result of a single computation of each corresponding shared XOR operation.

9. The process of claim 8 wherein searching the matrix to identify the set of one or more shared XOR operations further comprises steps for:

removing all edges from the graph having an edge counter value that is less than a maximum of the all edge counter values of the graph;

evaluating the remaining edges and identifying one or more maximal matchings of edges in the graph;

selecting one of the identified maximal matchings of edges; and identifying XOR operations corresponding to all of the edges in the selected maximal matching of edges as the set of one or more shared XOR operations.

10. The process of claim 9 further comprising:

for each node, counting a total number of edges entering each node prior to removal of the edges; and after removal of the edges, assigning an edge weight to each remaining edge as a function of a sum of the total number of edges that entered each of the two nodes on either end of each corresponding edge.

11. The process of claim 10 wherein selecting one of the identified maximal matchings of edges further comprises selecting the maximal matching of edges having a highest total weight based on a sum of the corresponding edge weights.

12. The process of claim 8 wherein an erasure encoding operation is performed, and wherein:

matrix inputs represent data packets of a distributed data storage node; and matrix outputs represent erasure coded data packets that are coded using the optimized coding matrix.

13. The process of claim 8 wherein:

the optimized coding matrix represents a decoding matrix for a particular one of a set of all possible erasure patterns of the erasure correcting code; and wherein a separate optimized coding matrix is constructed for each desired erasure pattern from the set of all possible erasure patterns of the erasure correcting code.

14. A computer storage device having computer executable instructions stored thereon for optimizing an XOR based code, comprising instructions for:

receiving a binary coding matrix representing XOR operations of erasure correcting code inputs for applying an erasure correcting code to the inputs to produce erasure correcting code outputs;

evaluating the binary coding matrix to identify all shared XOR operations by:

constructing a graph having nodes and edges between two or more of the nodes, wherein each node represents a different one of the inputs, wherein each edge corresponds to an XOR operation of the inputs represented by the node on each end of the edge, and assigning an edge counter value to each edge, said edge counter value representing a number times that the corresponding XOR operation is required to compute all erasure correcting code outputs; and constructing an optimized binary coding matrix by replacing all shared XOR operations with a single computation of a corresponding one of the shared XOR operations.

15. The computer storage device of claim 14 wherein evaluating the binary coding matrix to identify all shared XOR operations further comprises:

removing all edges from the graph having an edge counter value that is less than a maximum of the all edge counter values of the graph;

evaluating the remaining edges and identifying one or more maximal matchings of edges in the graph;

selecting one of the identified maximal matchings of edges; and identifying XOR operations corresponding to all of the edges in the selected maximal matching of edges as all of the shared XOR operations.

16. The computer storage device of claim 15 further comprising:

for each node, counting a total number of edges entering each node prior to removal of the edges; and after removal of the edges, assigning an edge weight to each remaining edge as a function of a sum of the total number of edges that entered each of the two nodes on either end of each corresponding edge.

17. The computer storage device of claim 16 wherein selecting one of the identified maximal matchings of edges further comprises selecting the maximal matching of edges having a highest total weight based on a sum of the corresponding edge weights.

18. The computer storage device of claim 14 wherein the optimized binary coding matrix represents a decoding matrix for a particular one of a set of all possible erasure patterns of the erasure correcting code; and wherein a separate optimized coding matrix is constructed for each desired erasure pattern from the set of all possible erasure patterns of the erasure correcting code.

* * * * *